(12) United States Patent
Maekawa

(10) Patent No.: US 7,767,569 B2
(45) Date of Patent: Aug. 3, 2010

(54) METHOD OF MANUFACTURING SEMICONDUCTOR DEVICE

(75) Inventor: Atsushi Maekawa, Tokyo (JP)

(73) Assignee: Elpida Memory, Inc., Tokyo (JP)

( * ) Notice: Subject to any disclaimer, the term of this patent is extended or adjusted under 35 U.S.C. 154(b) by 638 days.

(21) Appl. No.: 11/546,986

(22) Filed: Oct. 13, 2006

(65) Prior Publication Data

US 2007/0096188 A1 May 3, 2007

(30) Foreign Application Priority Data

Nov. 1, 2005 (JP) .............................. 2005-317991

(51) Int. Cl.
*H01L 21/8242* (2006.01)
*H01L 21/336* (2006.01)
(52) U.S. Cl. ................ 438/596; 438/637; 257/E21.649
(58) Field of Classification Search .................. 438/98, 438/100, 149, 151, 154, 155, 157, 167, 169, 438/176, 195, 233, 256, 279, 283, 399, 523, 438/533–534, 570, 571, 586, 597, 629, 666, 438/672, 675; 257/217, E21.649
See application file for complete search history.

(56) References Cited

U.S. PATENT DOCUMENTS

| | | | |
|---|---|---|---|
| 6,168,992 B1 * | 1/2001 | Lee | 438/256 |
| 6,326,270 B1 * | 12/2001 | Lee et al. | 438/279 |
| 6,723,608 B2 * | 4/2004 | Hayakawa | 438/299 |
| 7,427,564 B2 * | 9/2008 | Hwang et al. | 438/673 |
| 7,582,554 B2 * | 9/2009 | Moriwaki | 438/618 |
| 2001/0038114 A1 * | 11/2001 | Iljima et al. | 257/303 |
| 2002/0055222 A1 | 5/2002 | Kim et al. | |
| 2002/0086509 A1 * | 7/2002 | Park et al. | 438/586 |
| 2004/0016957 A1 * | 1/2004 | Wu | 257/316 |
| 2004/0063313 A1 * | 4/2004 | Shiratake et al. | 438/672 |
| 2005/0085072 A1 * | 4/2005 | Kim et al. | 438/684 |
| 2005/0090055 A1 * | 4/2005 | Lee et al. | 438/256 |

(Continued)

FOREIGN PATENT DOCUMENTS

CN 1624924 6/2005

(Continued)

OTHER PUBLICATIONS

Japanese Patent Office issued a Japanese Office Action dated Jul. 17, 2009, Application No. 2005-317991.

*Primary Examiner*—W. David Coleman
*Assistant Examiner*—Maliheh Malek
(74) *Attorney, Agent, or Firm*—Young & Thompson

(57) ABSTRACT

Method of forming a high-reliability contact plug which prevents a short circuit between the plug and a bit line by applying a material having an etching rate ratio of 100 or more with respect to a silicon nitride film which forms a self-aligned contact plug. After the formation of a bit line, whose top surface and side surfaces are covered with a silicon nitride film, a sacrificial interlayer film is formed which covers the whole surface of the bit line, and a contact hole is formed by etching the sacrificial interlayer film and then the lower-layer interlayer insulating film to form a capacitance contact plug. A column of a capacitance contact plug is then formed by removing the sacrificial interlayer film, a third interlayer insulating film is formed on the column, and part of this interlayer is removed to expose a surface of the contact plug.

9 Claims, 9 Drawing Sheets

U.S. PATENT DOCUMENTS

| | | |
|---|---|---|
| 2005/0118762 A1 | 6/2005 | Nakamura et al. |
| 2005/0153528 A1* | 7/2005 | Oyu et al. .................... 438/516 |
| 2005/0167839 A1 | 8/2005 | Wetzel et al. |
| 2005/0186732 A1* | 8/2005 | Yun ........................... 438/253 |
| 2005/0280035 A1* | 12/2005 | Lee et al. .................... 257/208 |
| 2006/0001161 A1* | 1/2006 | Graettinger et al. ......... 257/751 |
| 2006/0205141 A1* | 9/2006 | Park et al. ................... 438/239 |
| 2006/0264047 A1* | 11/2006 | Kim et al. ................... 438/684 |
| 2007/0059888 A1* | 3/2007 | Sukekawa ................... 438/279 |
| 2007/0111434 A1* | 5/2007 | Ikeda ........................ 438/253 |
| 2008/0061352 A1* | 3/2008 | Lee et al. .................... 257/315 |
| 2009/0061589 A1* | 3/2009 | Maekawa et al. ........... 438/386 |

FOREIGN PATENT DOCUMENTS

| | | |
|---|---|---|
| JP | 10-199978 | 7/1998 |
| JP | 10-335592 | 12/1998 |
| JP | 11-087493 | 3/1999 |
| JP | 2001-102550 | 4/2001 |
| JP | 2001-338977 | 12/2001 |
| JP | 2002-009174 | 1/2002 |
| JP | 2002-110791 | 4/2002 |
| JP | 2002-222858 | 8/2002 |
| JP | 2004-304141 | 10/2004 |
| JP | 2007-523034 | 8/2007 |
| WO | 2005/074449 | 8/2005 |

* cited by examiner

PRIOR ART

PRIOR ART

METHOD OF MANUFACTURING SEMICONDUCTOR DEVICE

BACKGROUND OF THE INVENTION

1. Field of the Invention

The present invention relates to a method of manufacturing a semiconductor device, particularly to a method of manufacturing a DRAM (Dynamic Random Access Memory) in which the short margin of a fine capacitance contact formed by self-alignment is increased.

2. Description of the Prior Art

In recent DRAMs, the adoption of the COB (Capacitor Over Bitline) construction has become mainstream because it is easy to ensure the capacity of a capacitor. In a memory cell of the COB construction, a word line which is formed on the surface of a semiconductor substrate, a bit line which is arranged on the word line via an interlayer insulating film so as to be orthogonal to the word line, and a capacitor which is formed above the bit line via an interlayer insulating film are main component elements. In order to ensure that short circuits are not formed with the word line and the bit line, the capacitor which is present in the highest position is connected to the semiconductor substrate via a contact plug which is formed by threading the gaps between the lines.

Hereinafter, a memory cell of the above-described COB construction will be further described by using the sectional view shown in FIG. 1. FIG. 1 is shown in a section in a direction parallel to a word line (perpendicular to a bit line).

An element isolation region 102, and a drain 103 and a source 104 which consist of an n-type diffusion layer are provided in a prescribed region of the surface of a p-type semiconductor substrate 101. A first interconnect layer 105, which becomes a word line, is provided via a gate insulating film formed on the surface of the semiconductor substrate 101, and the first interconnect layer 105 is covered with a first interlayer insulating film 106. First contact plugs 107 and 108 are provided in a prescribed region of the first interlayer insulating film 106. A second interlayer insulating film 109 is provided on the surfaces of the first contact plugs 107, 108 and the first interlayer insulating film, and a second contact plug 110, which becomes a bit line contact plug, is provided so as to establish a connection to the first contact plug 107. A second interconnect layer 111, which becomes a bit line, is provided on the second contact plug 110, and the second interconnect layer is covered with a third interlayer insulating film 112. A third contact plug 113, which becomes a capacitance contact plug, is provided in the third interlayer insulating film 112 so as to establish a connection to the first contact plug 108 between the second interconnect layers 111. A fourth interlayer insulating film 114 is provided on the surfaces of the third contact plug 113 and the third interlayer insulating film, a cylinder hole is provided at a position corresponding to the third contact plug in the fourth interlayer insulating layer, and a lower electrode 115 of the capacitor is provided on an inner surface of the cylinder hole so as to establish a connection to the third contact plug. A capacitance insulating film 116 and an upper electrode 117 are provided so as to cover the lower electrode 115. Furthermore, a third interconnect layer 119 is provided via a fifth interlayer insulating film 118, whereby a memory cell of the COB construction is formed.

In a DRAM of the above-described COB construction, because of requirements for an improvement in integration level, a memory cell is keeping on decreasing in size. For this reason, also the plane area allowed for each component element must be decreased and the formation of each of the above-described contact plugs has also become very difficult. In particular, in the formation of the capacitance contact plug (the third contact plug) formed between adjacent bit lines (the second interconnect layer), it is necessary to increase the thickness of the interlayer insulating film which insulates the bit line and the capacitor in order to ensure the fabrication margin of the capacitor, and for this reason, the working margin becomes small, thereby bringing the formation of the capacitance contact plug into a more difficult situation. The SAC (Self Aligned Contact) method is adopted in order to reduce this difficulty.

Hereinafter, a method of manufacturing a capacitance contact plug by a conventional SAC method will be described in detail by using sectional views of a series of steps shown in FIGS. 2A to 2E. In these figures, a semiconductor substrate and a word line formed on the semiconductor substrate are omitted.

First, as shown in FIG. 2A, first contact plugs 107 and 108 are formed in a prescribed region of a first interlayer insulating film 106 which covers a word line. Next, a second interlayer insulating layer 109 which consists of a silicon oxide film having a thickness of 150 nm is formed, and a second contact plug 110 is formed so as to establish a connection to the first contact plug 107. After that, a film of a metal material having a thickness of 70 nm is formed, which becomes a bit line, and on top of this film a silicon nitride film 120 having a thickness of 60 nm is further formed. The silicon nitride film 120 and the film of the metal material are worked by lithography and dry etching, whereby a bit line 111 is formed. After that, a side wall which consists of a silicon nitride film 121 having a thickness of 20 nm is formed by a publicly known method.

Next, as shown in FIG. 2B, a third interlayer insulating film 112 which consists of a silicon oxide film having a thickness of 800 nm is formed overall, the surface is planarized by the CMP (Chemical Mechanical Polishing) method so that the remaining film thickness provides the third interlayer insulating film 112 of 400 nm. A silicon film 122 having a thickness of 80 nm is formed on top of the third interlayer insulating film 112. Furthermore, a photoresist 123 is formed and a prescribed pattern is formed by a publicly known method.

Next, as shown in FIG. 2C, the silicon film 122 is dry etched by using the photoresist 123 as a mask and the pattern is transferred. The silicon film 122 on which the pattern has been transferred is used as a hard mask to dry etch a lower-layer insulating film. After that, the third interlayer insulating film 112 which consists of the silicon oxide film having a thickness of 400 nm and the second interlayer insulating film 109 which consists of the silicon oxide film having a thickness of 150 nm are etched and a contact hole 124 is formed. At this time, the silicon nitride films 120 and 121 which cover the bit line 111 have a lower etching rate than the silicon oxide film, and hence can form the contact hole of the silicon oxide film in a self-aligning manner and the bit line 111 will not be exposed even when the end portion of the contact hole 124 is present above the bit line 111.

Next, as shown in FIG. 2D, a polycrystalline silicon film 125 which contains phosphorus is formed in such a manner that the contact hole 124 is buried. Subsequently, as shown in FIG. 2E, the polycrystalline silicon 125 on the surface is removed by the CMP method, and a third contact plug 113 made of polycrystalline silicon is formed.

Methods of forming a contact plug which are similar to the above-described method are disclosed in Japanese Patent Application Laid-Open No. 2001-102550 and Japanese Patent Application Laid-Open No. 2004-304141.

However, with progress in miniaturization, it has become difficult to form high-reliability contact holes even by use of the above-described SAC method. In the SAC method, by covering a bit line with a silicon nitride film having a lower etching rate than a silicon oxide film, it is ensured that the bit line is not exposed during the etching of the silicon oxide film. The etching rate ratio between silicon oxide and silicon nitride in dry etching is 5 to 7 or so, and it is difficult to dramatically change this value even by changing dry etching conditions. This is because both silicon oxide and silicon nitride are silicon compounds and in an environment of dry etching it is difficult to expand the difference in the etching rate. Hereinafter, an investigation will be made into a thickness of a silicon nitride film which remains on a bit line in the part indicated by a circle mark A in FIG. 2C under this condition when the above-described related art is used.

The thickness of a silicon oxide film which must be etched after the exposure of the surface of a silicon nitride film formed on a bit line is 280 nm in total, of which 60 nm are for the thickness of the silicon nitride film, 70 nm are for the thickness of the bit line and 150 nm are for the thickness of the second interlayer insulating film. If the etching rate ratio between the silicon oxide film and the silicon nitride film is 7, the silicon nitride film is etched by about 40 nm during the etching of the silicon oxide film by 280 nm. Because the thickness of the silicon nitride film formed on the bit line is 60 nm, a silicon nitride film having a thickness of 20 nm remains. If the silicon nitride film having a thickness of 20 nm remains, no short circuit occurs between the third contact plug 113 and the bit line 111 in the part indicated by a circle mark A in FIG. 2E.

However, when the contact hole diameter decreases, the deeper a contact hole, the lower the etching rate will be and it becomes impossible to maintain the above-described etching rate ratio. That is, in the etching of the second interlayer insulating film shown in FIG. 2C, the etching rate becomes lower and the etching rate ratio with respect to the silicon nitride film decreases to about 4. As the result, the silicon nitride film having a thickness of 60 nm formed on the bit line is completely etched before the surface of the first contact plug 108 is exposed, thereby posing the problem that the third contact plug 113 and the bit line 111 form a short circuit in the part indicated by a circle mark A. Although this problem can be solved to a certain extent by increasing the thickness of the silicon nitride film, another problem will arise; for example, the formation of the third interlayer insulating film 112 will undesirably become difficult.

In view of the above problem, the object of the present invention is to provide a method of forming a high-reliability contact plug which prevents a short circuit between the contact plug and a bit line by applying a material having a large etching rate so that the etching rate ratio with respect to a silicon nitride film in an interlayer film which forms the contact plug is infinite, to prevent the etching of the silicon nitride film during the etching of the interlayer film, with the result that the thickness of the silicon nitride film remaining on the bit line is ensured. The object of the present invention is also to provide a method of manufacturing a semiconductor device in which this method of forming the contact plug is used.

SUMMARY OF THE INVENTION

To achieve the above objects, a method of manufacturing a semiconductor device of the present invention comprises at least the steps of: forming multiple word lines on a semiconductor substrate and forming a first interlayer insulating film which covers the whole surface of the word lines; forming a first contact plug which establishes a connection to the semiconductor substrate in multiple prescribed regions of the first interlayer insulating film; forming a second interlayer insulating film which consists of a silicon oxide film on the whole surface of the first contact plug and the first interlayer insulating film and forming a bit line contact plug which establishes a connection to part of the first contact plug in multiple prescribed regions of the second interlayer insulating film; forming a bit line on the bit line contact plug; forming an amorphous carbon film which covers the whole surface of the bit line; forming a capacitance contact plug which establishes a connection to part of the first contact plug by piercing through the amorphous carbon film and the second interlayer insulating film in multiple prescribed regions of the amorphous carbon film; removing the amorphous carbon film after forming the capacitance contact plug, to form a column of the capacitance contact plug; forming a third interlayer insulating film which consists of a silicon oxide film on the whole surface of the column of the capacitance contact plug after forming the column and removing part of the third interlayer insulating film from a surface thereof, to expose a surface of the capacitance contact plug; forming a fourth interlayer insulating film on the whole surface of the capacitance contact plug and the third interlayer insulating film and forming a cylinder hole in a prescribed region of the fourth interlayer insulating film, to expose a surface of the third contact hole; forming a lower electrode of a capacitor on an inner surface of the cylinder hole; and forming a capacitance insulating film and an upper electrode of the capacitor on the whole surface including the surface of the lower electrode.

The top surface and the side surfaces of the bit line are covered with a silicon nitride film in the stage before forming the amorphous carbon film.

Further, the step of forming the capacitance contact plug may comprise the steps of: forming a first contact hole in the amorphous carbon film; forming thereafter an insulating film on the whole surface including the inner surface of the first contact hole; forming thereafter a second contact hole in the insulating film; and forming the capacitance contact plug.

According to the present invention, a sacrificial interlayer film made of amorphous carbon is formed, with a top surface and side surfaces of a bit line, which is formed on a second interlayer insulating film formed on a first contact plug, covered with silicon nitride. Because amorphous carbon can be dry etched with a gas which does not contain halogen gases, such as oxygen, hydrogen and ammonia, it is possible to form a contact hole in the amorphous carbon without etching in the last the silicon nitride film covering the bit line. Therefore, it becomes possible to cause silicon nitride film having a sufficient thickness to remain on the bit line and this provides the advantage that it is possible to prevent the contact plug and the bit line from forming a short circuit. Also, after the formation of the contact plug, it is possible to selectively remove only the amorphous carbon without exerting an adverse effect on the other structures by using oxygen or the like. After that, it is possible to form an interlayer insulating film made of silicon oxide so as to cover the contact plug and, therefore, this provides the advantage that the succeeding capacity formation step can be performed by using conventional techniques.

According to the present invention, a second interlayer insulating film is formed on the surface of the first contact plug and the amorphous carbon is formed on the second interlayer insulating film, whereby the contact hole is formed, with the amorphous carbon being not in direct contact with the first contact plug. Therefore, it is possible to avoid the problem that it is difficult to ensure a conducting state between the first contact plug and the capacitance contact plug in a case where the contact hole is formed with the amorphous carbon in direct contact with the first contact plug.

DETAILED DESCRIPTION OF PREFERRED EMBODIMENTS

Hereinafter, embodiments of the present invention will be described in detail by using the drawings.

Embodiment 1

First, a description will be given of the first embodiment of the present invention, in which amorphous carbon is used for a sacrificial interlayer film which forms a contact hole, by using the sectional views of a series of steps shown in FIGS. 3A to 3K. Incidentally, the steps until the formation of a first interconnect layer which forms a word line are omitted.

Figure 3A:
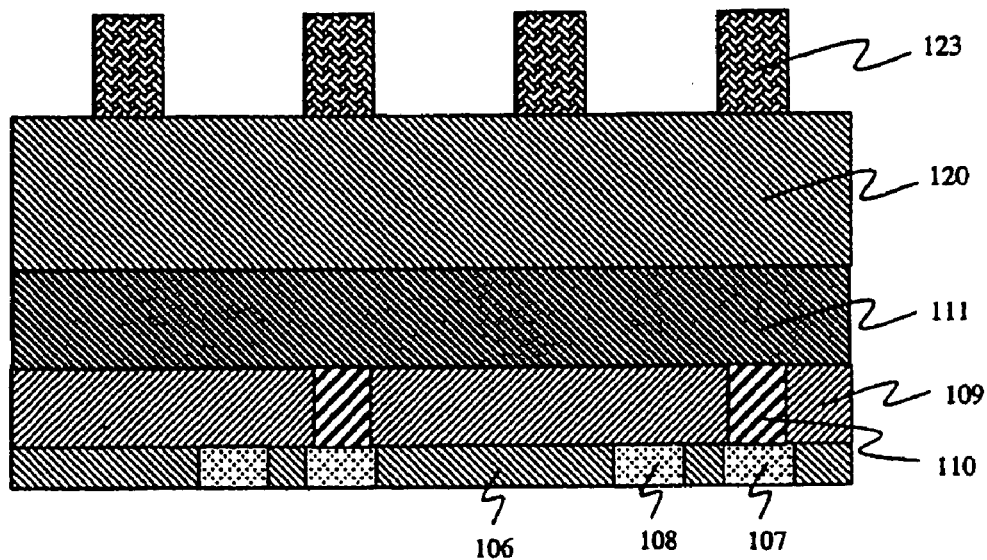
FIGS. 3A to 3K are sectional views of a series of steps to explain the first embodiment of the present invention.

First, as shown in FIG. 3A, first contact plugs 107 and 108, which are made of polycrystalline silicon, were formed in a prescribed region of a first interlayer insulating film 106 made of silicon oxide, a second interlayer film 109 which consists of a silicon oxide film having a thickness of 150 nm was formed on top of the first contact plugs, and a second contact plug, which becomes a bit line contact plug, was formed in a prescribed region of the second interlayer insulating film. The bit line contact plug can be formed by burying titanium nitride and tungsten by use of the CVD (Chemical Vapor Deposition) method after the formation of a contact hole. Next, a tungsten nitride film having a thickness of 10 nm and a tungsten film having a thickness of 60 nm were laminated by the sputtering method, to form a second interconnect layer 111 which becomes a bit line. Furthermore, a silicon nitride film 120 having a thickness of 100 nm was deposited by use of the plasma CVD method and a photoresist pattern 123 was formed on the silicon nitride film. It is preferred that as required, before the formation of the photoresist pattern, an anti-reflection film is formed on the silicon nitride film 120.

Figure 3B:
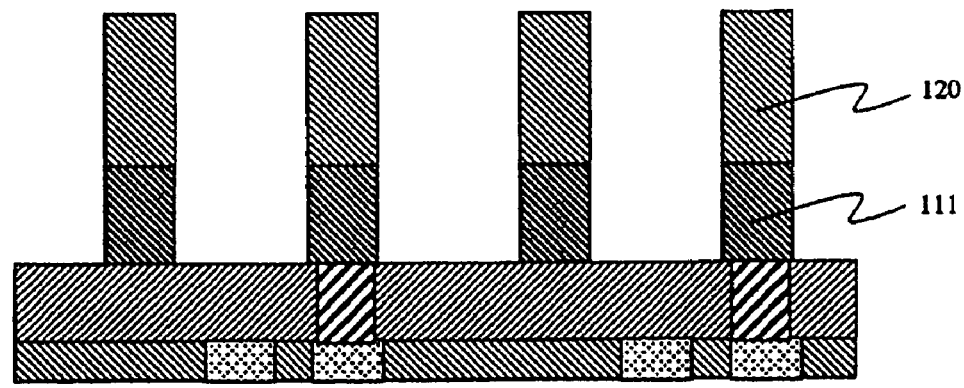

Next, as shown in FIG. 3B, the silicon nitride film 120 was dry etched by using a gas plasma which contains fluorine, with the photoresist pattern 123 serving as a mask. Subsequently, a bit line 111 was formed by dry etching the second interconnect layer 111 by using a gas plasma which contains chlorine, with the silicon nitride film 120 serving as a mask. In this stage, the thickness of the silicon nitride film remaining on the bit line 111 was 60 nm.

Figure 3C:
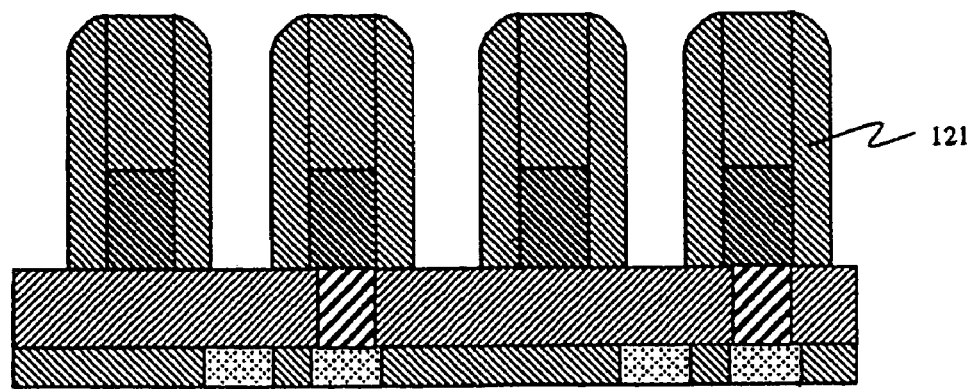

Next, as shown in FIG. 3C, side walls 121 were formed on the bit line 111 and the silicon nitride film 120 by a publicly known method. A silicon nitride film having a thickness of 20 nm, which is formed by the CVD method, was used as the side wall 121. In this stage, the top surface and the side surfaces of the bit line 111 were covered with the silicon nitride films.

Figure 3D:
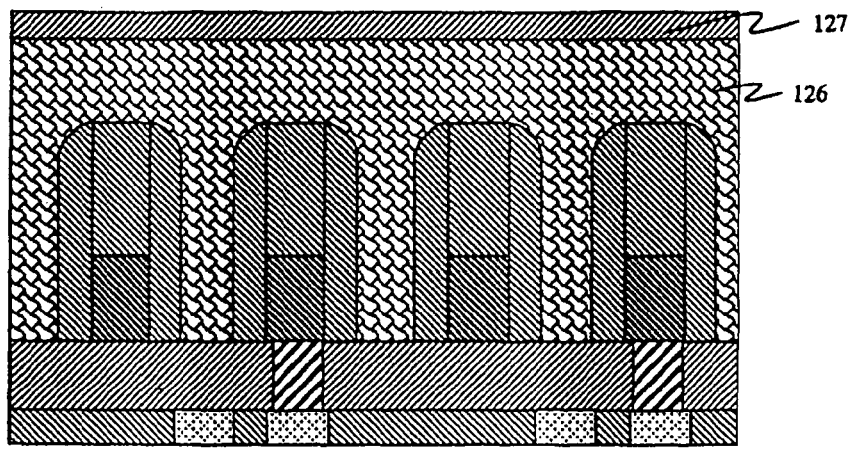

Next, as shown in FIG. 3D, a sacrificial interlayer film which consists of an amorphous carbon film 126 having a thickness of 300 nm was formed. In the formation of the amorphous carbon film 126 having a thickness of 300 nm, it is possible to use the plasma CVD method at a temperature of 550° C. by use of butane ($C_4H_{10}$) as a raw material gas. It is also possible to use a hydrogenated carbon gas as the raw material gas in addition to butane. In this stage, the bit line 111 covered with the silicon nitride film was completely coated with the sacrificial interlayer film which consists of the amorphous carbon film 126. Next, a silicon oxide film 127 having a thickness of 70 nm was formed by the plasma CVD method.

Figure 3E:
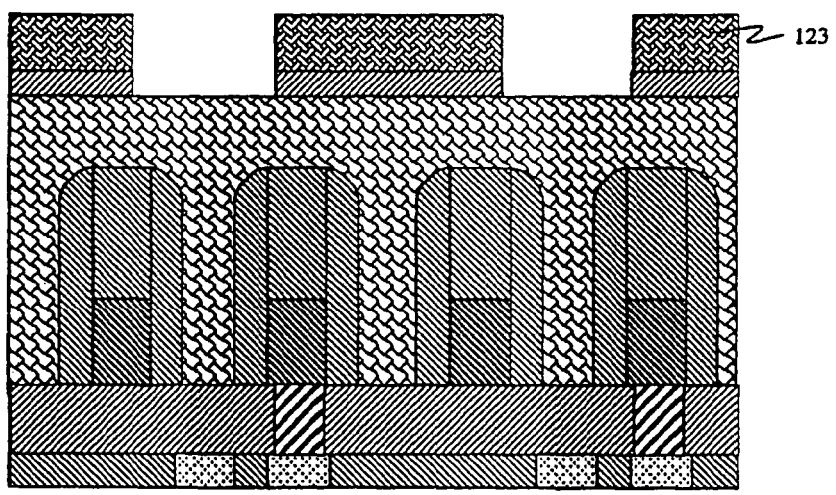

Next, as shown in FIG. 3E, a photoresist pattern 123 was formed by a publicly known lithography method, and the silicon oxide film 127 was dry etched by using a gas plasma which contains fluorine, with the photoresist pattern serving as a mask. Usually, in a case where photolithography is performed with a metal such as the bit line 111 being present in an under layer, irradiated light reflects from the metal, thereby exerting an adverse effect on the formation of the pattern of the photoresist and, therefore, it is necessary to provide an anti-reflection layer having a thickness of 100 nm or so under the photoresist. However, because the amorphous carbon film 126 has a light-absorbing effect, the use of the amorphous carbon film has the advantage that the formation of an anti-reflection layer can be omitted. In this embodiment, a very thin silicon nitride film having a thickness of 15 nm was provided as an anti-reflection layer by the plasma CVD method (not shown in the drawing).

Figure 3F:
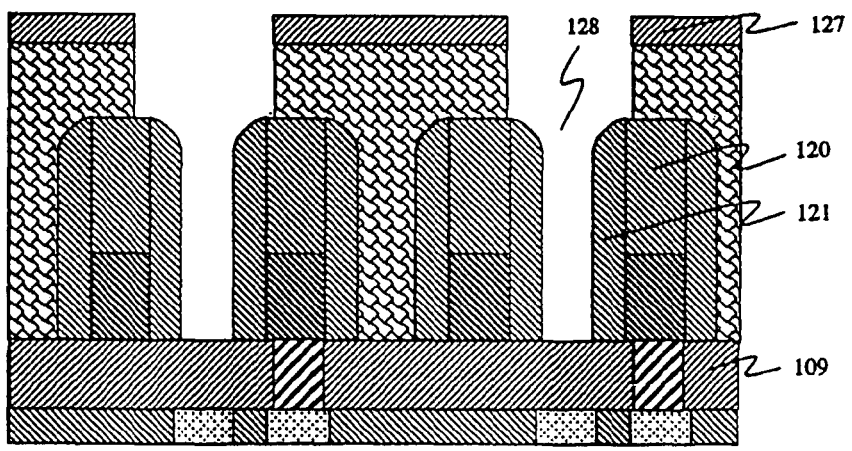

Next, as shown in FIG. 3F, the sacrificial interlayer film which consists of the amorphous carbon film 126 was dry etched by using the silicon oxide film 127 as a mask and a first contact hole 128 was formed. Because the component element of the amorphous carbon film 126 is carbon, it is possible to perform etching by a gas plasma which contains oxygen or hydrogen. Because the etching gas does not contain fluorine nor chlorine, the silicon oxide films 109 and 127, and the silicon nitride films 120 and 121 are never etched. Therefore, it is possible to etch the amorphous carbon film at a selection ratio (etching rate ratio) which is substantially infinite with respect to the silicon oxide film and the silicon nitride film. In this embodiment, the etching was performed by using a mixed gas plasma of oxygen and argon gas. As the plasma conditions, the pressure was 15 mTorr, the high-frequency power was 300 W, and the temperature was 20° C. In addition to the above-described mixed gas, it is also possible to use a mixed gas of hydrogen and nitrogen, ammonia or the like. During the dry etching of the amorphous carbon film 126, the photoresist 123 was completely etched and disappeared.

Figure 3G:
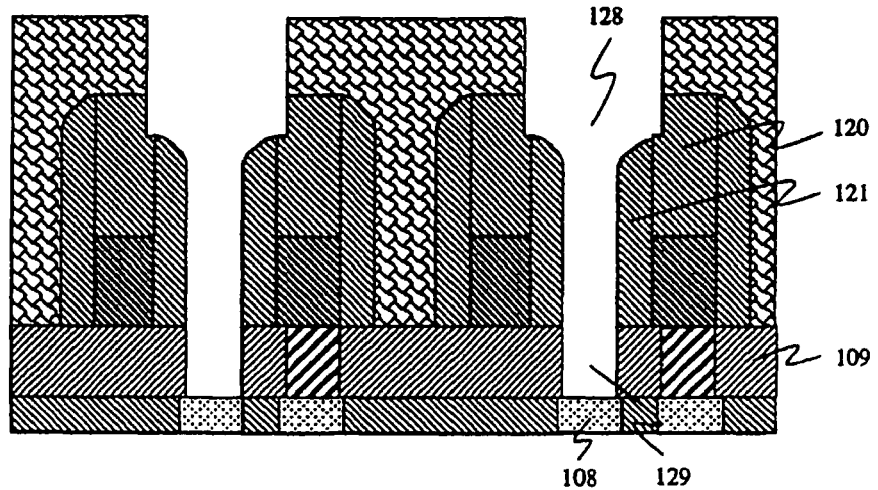

Next, as shown in FIG. 3G, the second interlayer insulating film 109 exposed to the bottom of the first contact hole 128 was dry etched to form a second contact hole 129, whereby the first contact plug 108 was exposed. In the dry etching of the second interlayer insulating film 109, octafluorocyclopentane ($C_5F_8$) was used as a main etching gas. The pressure was 40 mTorr. In this embodiment, the thickness of the second interlayer insulating film 109 was 150 nm. Therefore, if the etching rate ratio of the silicon oxide film with respect to the silicon nitride film is 4, the silicon nitride film 120 on the bit line 111 is etched by 38 nm and it is possible to cause the silicon nitride film having a thickness of 22 nm, whereby sufficient insulating properties can be maintained. The silicon oxide film 127 which was used as the mask for etching was simultaneously etched during the etching of the second interlayer insulating film 109 and disappeared automatically.

Figure 3H:
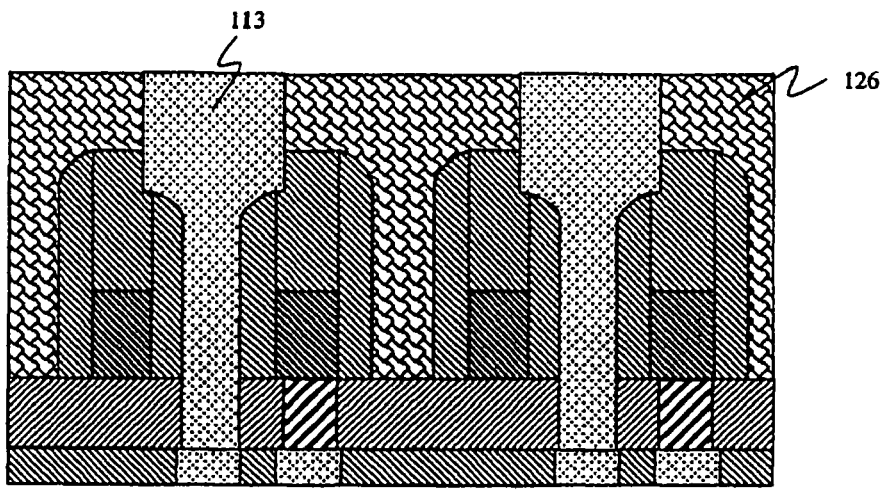

Next, as shown in FIG. 3H, a silicon film which contains phosphorus was formed by the CVD method so that the first contact hole 128 was buried, and the silicon film which has been formed on the surface was thereafter etched back by a publicly known method, whereby a third contact plug 113 made of polycrystalline silicon was formed. Although the third contact plug 113 can be formed in a polycrystalline state during deposition, it is also possible to form the third contact plug in an amorphous state and to perform polycrystallization by heat treatment in a later step. Because the amorphous carbon film 126 is formed at 550° C., it is desirable to form the silicon film at a lower temperature in order to prevent the amorphous carbon film 126 from being thermally deformed. Although a temperature of about 600° C. is necessary for forming the silicon film in a polycrystalline state, the silicon film in an amorphous state can be formed at 530° C. and the amorphous carbon film 126 is not thermally deformed in the least. Therefore, it is preferred that the silicon film is formed in an amorphous state.

Figure 3I:
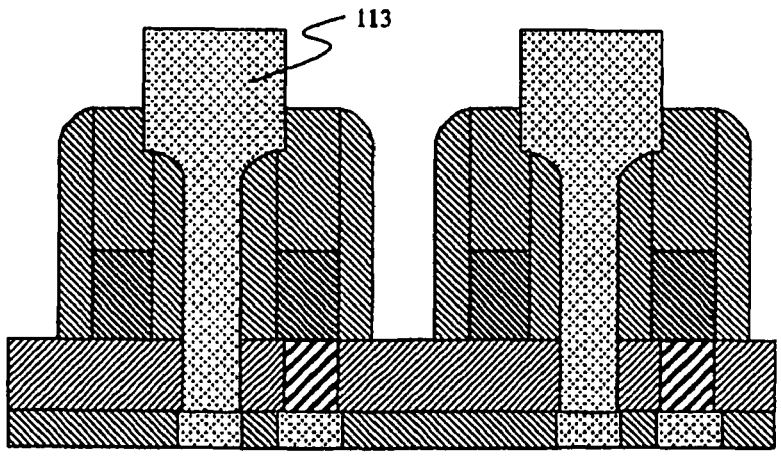

Next, as shown in FIG. 3I, the sacrificial interlayer film which consists of the amorphous carbon film 126 was completely removed. Because the amorphous carbon film 126 can be removed by oxygen or the like without using halogen elements such as fluorine in the same way as the formation of the contact hole, the removal of the amorphous carbon film can be performed without any adverse effects on the third contact plug 113, the silicon nitride films 120 and 121, and the silicon oxide film 109. A column of the third contact plug 113 is formed by removing the amorphous carbon film 126.

Figure 3J:
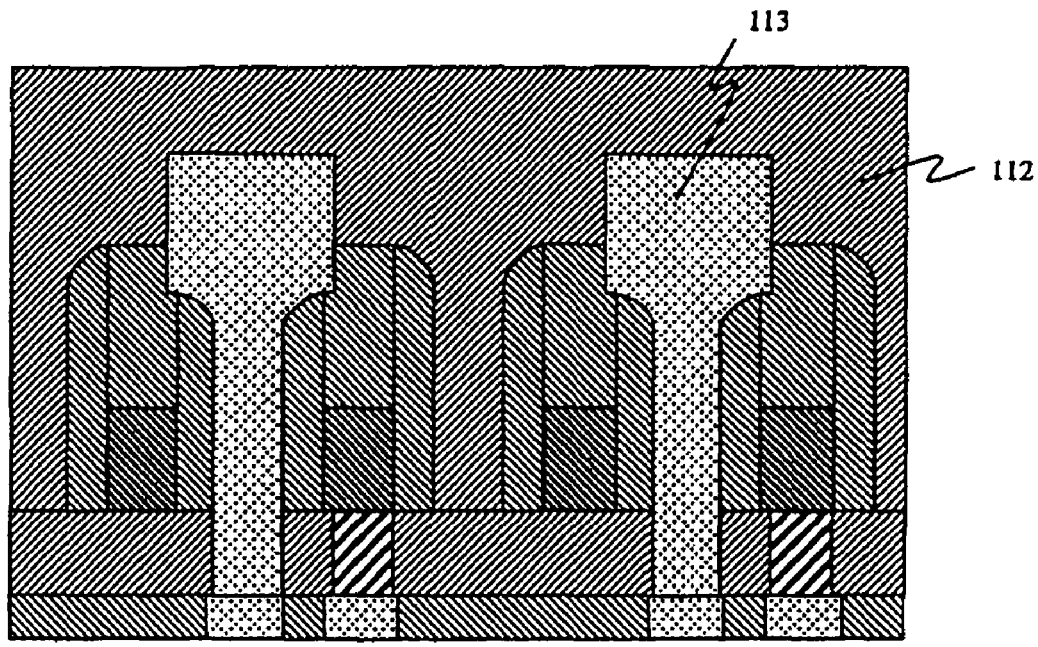

Next, as shown in FIG. 3J, a third interlayer insulating film 112 which consists of a silicon oxide film having a thickness of 350 nm was formed so as to completely cover the third contact plug 113 by the HDP (High Density Plasma)-CVD method by using monosilane (SiH$_4$) and oxygen as raw material gases.

Figure 1:
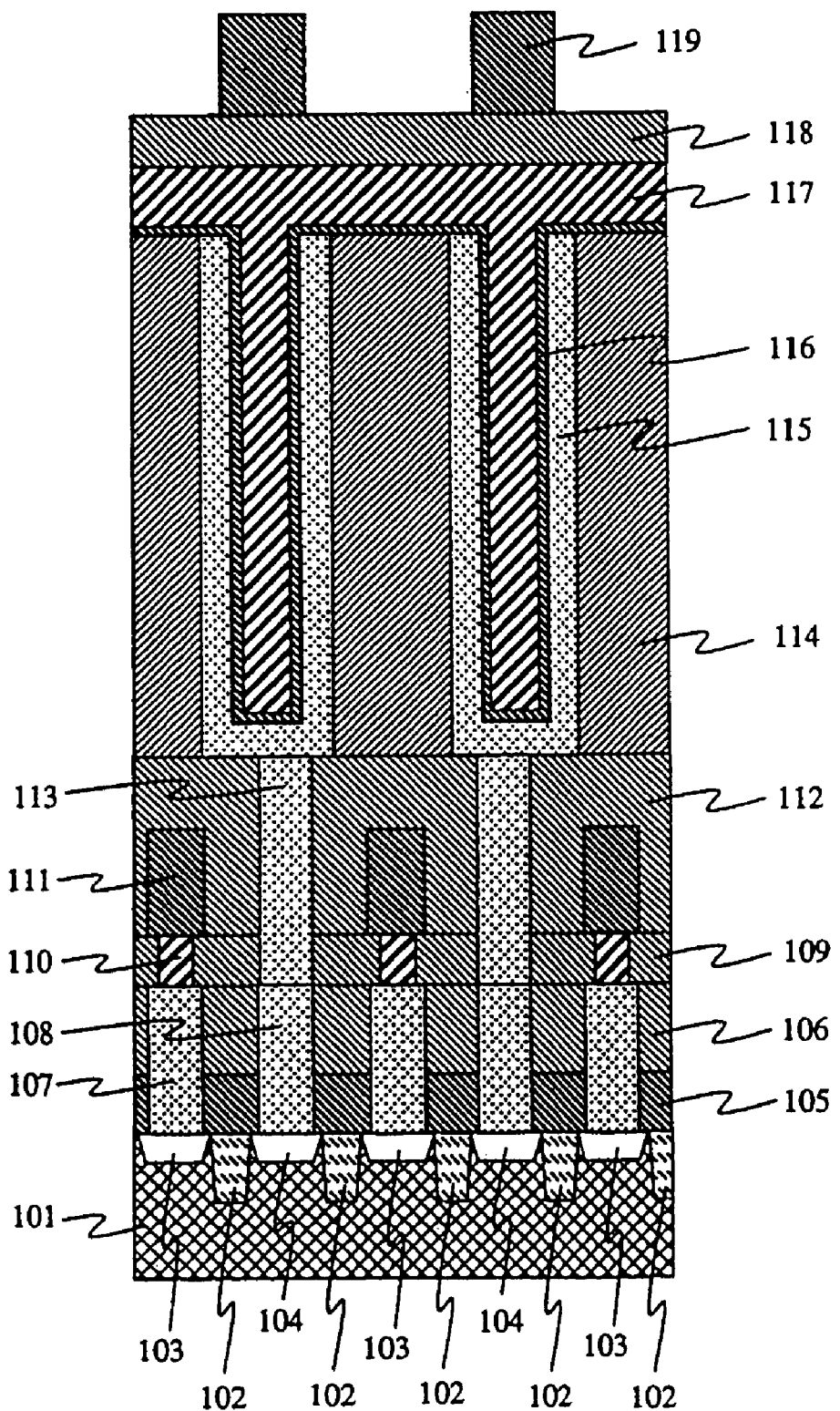
FIG. 1 is a sectional drawing to explain the construction of a DRAM cell of the COB construction.
Figure 2A:
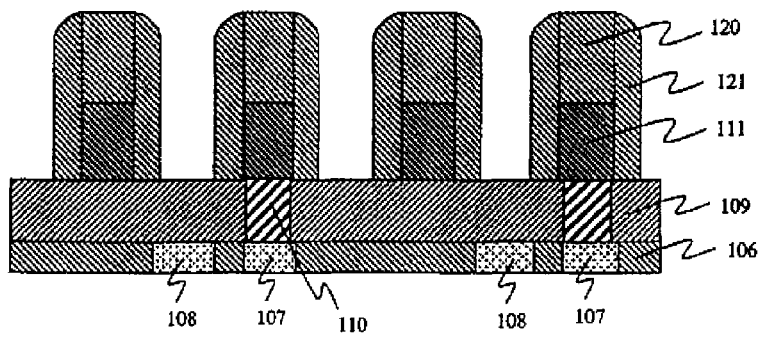
FIGS. 2A to 2E are sectional views of a series of steps to explain conventional problems.
Figure 2B:
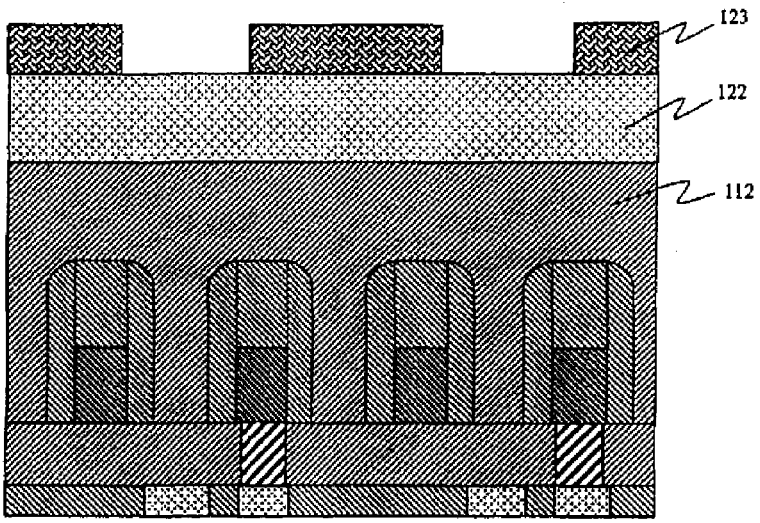
Figure 2C:
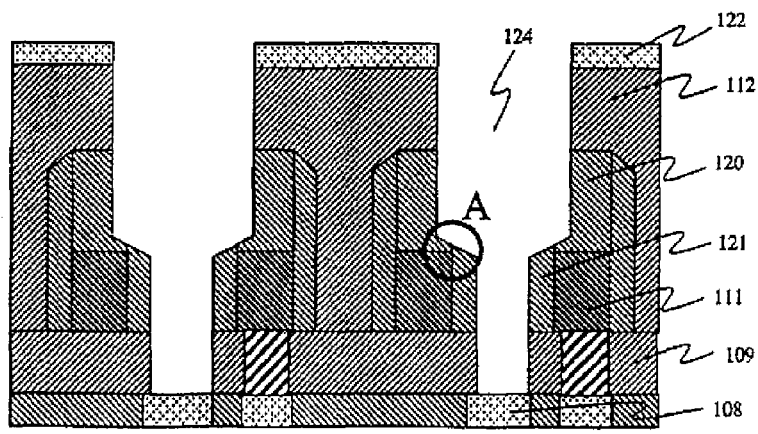
Figure 2D:
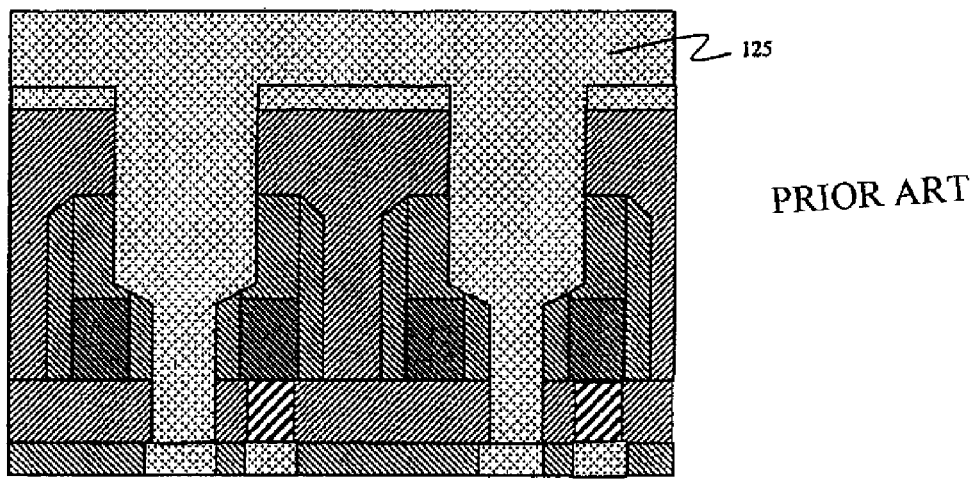
Figure 2E:
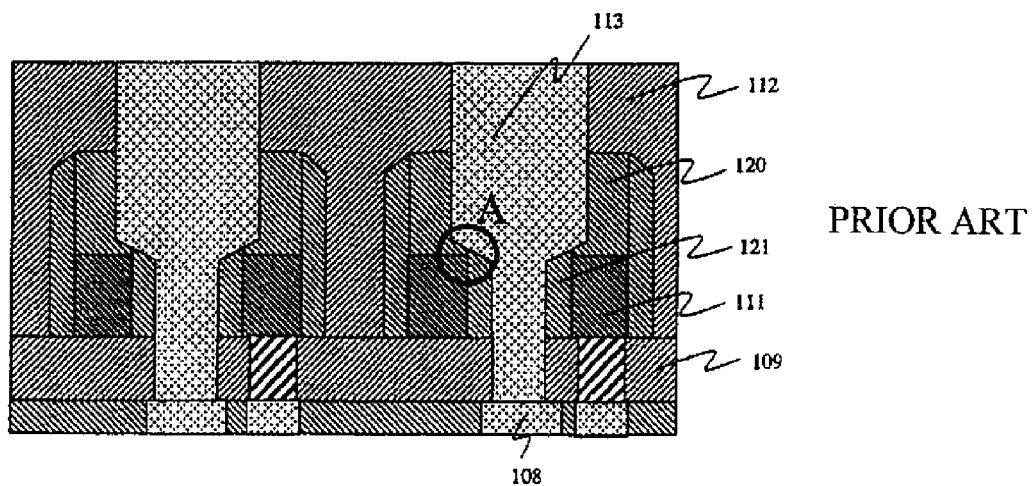
Figure 3K:
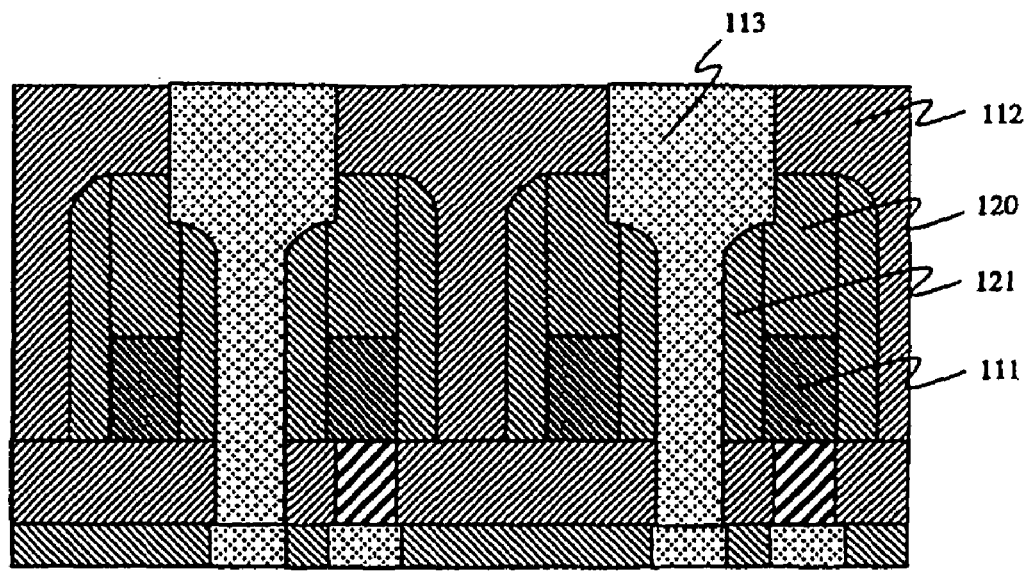

Next, as shown in FIG. 3K, the surface of the third interlayer insulating film 112 was polished by the CMP method and the surface of the third contact plug 113 was exposed. Hereinafter, as shown in FIG. 1, a semiconductor device which composes a DRAM can be manufactured by performing the formation of a fourth interlayer insulating film 114, the formation of a cylinder hole, the formation of a lower electrode 115 of a capacitor, the formation of a capacitance insulating film 116 and an upper electrode 117, the formation of a fifth interlayer insulating film 118 and the formation of a third interconnect layer 119 by a publicly known method.

According to this embodiment, the sacrificial interlayer film which consists of the amorphous carbon film 126 is formed, with the top surface and the side surfaces of the bit line 111 which is formed on the second interlayer insulating film 109 formed on the first contact plug 108, covered with the silicon nitride films 120 and 121. Because the amorphous carbon film 126 can be dry etched with a gas which does not contain halogen gases, such as oxygen, hydrogen and ammonia, it is possible to form the contact hole 128 in the amorphous carbon film without etching in the last silicon nitride films 120 and 121 covering the bit line 111. Therefore, it becomes possible to cause the silicon nitride films 120 and 121 having a sufficient thickness to remain on the bit line 111 and this provides the advantage that it is possible to prevent the third contact plug 113 and the bit line 111 from forming a short circuit. Also, after the formation of the third contact plug 113, it is possible to remove only the amorphous carbon 126 without exerting an adverse effect on the other structures by using oxygen or the like. After that, it is possible to form the third interlayer insulating film 112 which consists of a silicon oxide film so as to the cover third contact plug 113 and, therefore, this provides the advantage that the succeeding capacity formation step can be performed by using conventional techniques.

According to this embodiment, the second interlayer insulating film 109 is formed on the surface of the first contact plug 108 and the amorphous carbon film 126 is formed on the second interlayer insulating film, whereby the contact holes 128 and 129 are formed, with the amorphous carbon film 126 being not in direct contact with the first contact plug 108. Therefore, this provides the advantage that it is possible to avoid the problem that it is difficult to ensure a conducting state between the first contact plug 108 and the third contact plug 113 in a case where the contact hole is formed with the amorphous carbon film 126 in direct contact with the first contact plug 108.

Embodiment 2

In the above-described first embodiment, after the formation of the contact hole in the amorphous carbon film and in the second interlayer insulating film, the third contact plug which consists of a silicon film was formed. Because the amorphous carbon film is formed by the plasma CVD method, the step coverage becomes a little worse. For example, if the amorphous carbon film is formed so as to cover the bit lines which are densely arranged, it is impossible completely bury the spacing between adjacent bit lines, whereby the occurrence of voids is feared. If the voids occur, the silicon film is formed in the voids and this may give rise to the problem that the adjacent contact plugs form a short circuit.

In this second embodiment, a description will be given of a method by which after the formation of the first contact hole in the amorphous carbon film, side walls of the first contact hole are coated with an insulating film, and even if voids occur in the amorphous carbon film, the voids are blocked by the insulating film, and after that, the formation of the second contact hole and the formation of the third contact plug which consists of a silicon film are performed.

The second embodiment will be described by using the sectional views of a series of steps shown in FIGS. 4A to 4F. Incidentally, the steps until the formation of the contact hole in the amorphous carbon film 126 are the same as in Embodiment 1 and their descriptions are omitted.

Figure 4A:
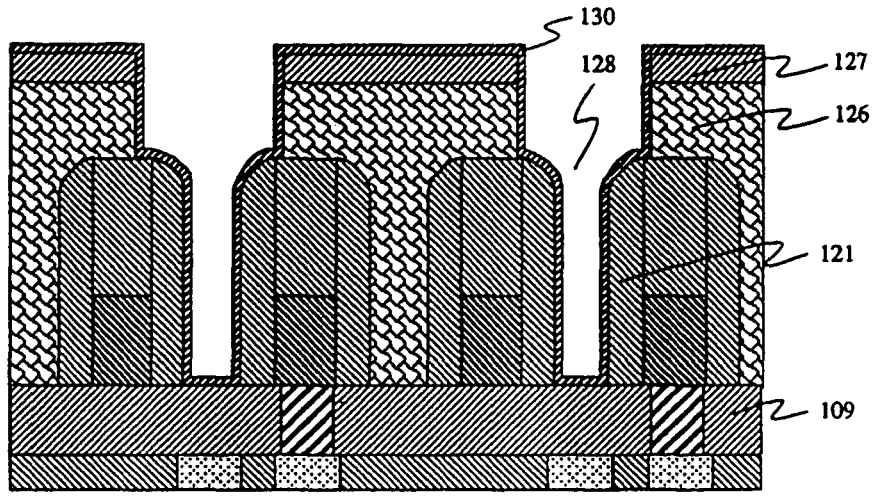
FIGS. 4A to 4F are sectional views of a series of steps to explain the second embodiment of the present invention.

First, as shown in FIG. 4A, a first contact hole 128 was formed in a sacrificial interlayer film which consists of an amorphous carbon film 126 by using a silicon oxide film 127 as a mask and after that, a silicon oxide film 130 having a thickness of 10 nm was formed. The silicon oxide film 130 can be formed by the plasma CVD method by using tertaethoxysilane (TEOS: Si(OC$_2$H$_5$)$_4$) as a raw material gas. The film formation temperature was 450° C. Owing to the formation of the silicon oxide film 130, even when voids of the amorphous carbon film 126 are present between the adjacent silicon nitride films 121, the voids can be blocked by the silicon oxide film 130. The ALD (Atomic Layer Deposition) method and the like can be used in addition to the plasma CVD method.

Figure 4B:
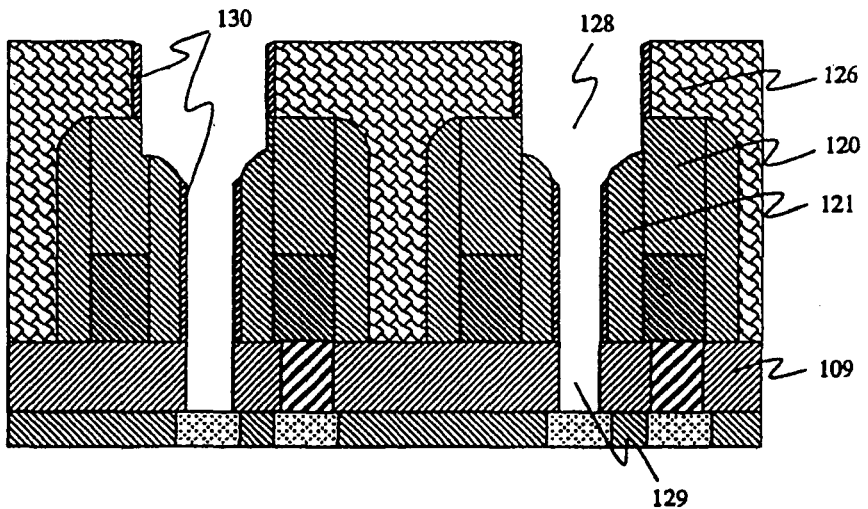

Next, as shown in FIG. 4B, a second contact hole 129 was formed by dry etching the silicon oxide film 130 which had been present on the bottom of the first contact hole 128 and a second interlayer insulating film 109 which consists of a silicon oxide film. The silicon oxide films 130 and 127 on the surface are etched and disappear automatically. The silicon oxide film 130 on the side walls of the amorphous carbon film 126 and the side walls of the silicon nitride film 121 remain. Therefore, the condition in which voids are blocked is maintained.

Figure 4C:
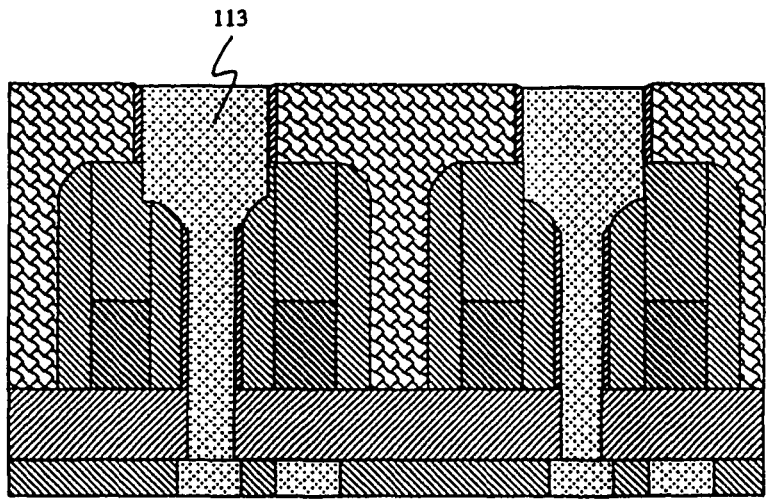

Next, as shown in FIG. 4C, a third contact plug 113 which consists of a silicon film was formed.

Figure 4D:
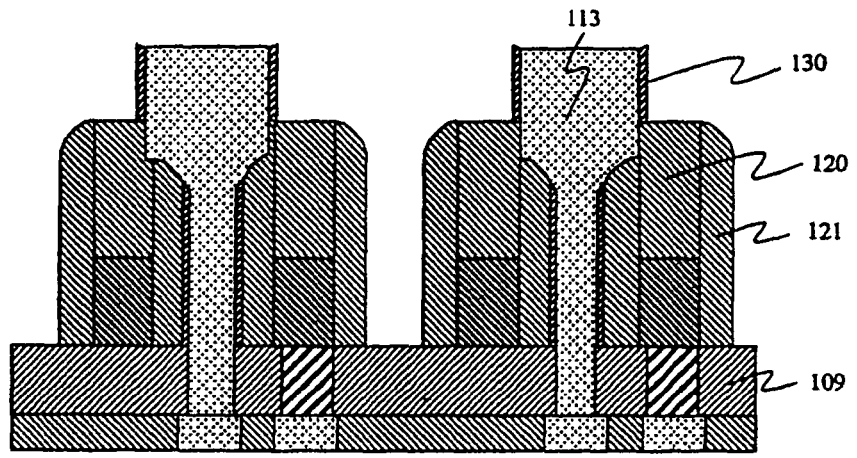

Next, as shown in FIG. 4D, the amorphous carbon film 126 was removed, to form a column of the third contact plug 113. The silicon oxide film 130 on the side walls of the third contact plug 113 remains.

Figure 4E:
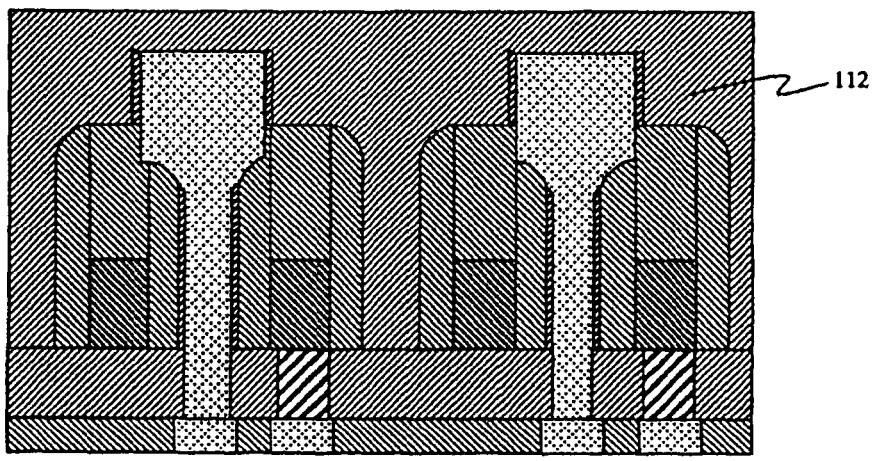

Next, as shown in FIG. 4E, a third interlayer insulating film 112 which consists of a silicon oxide film by the HDP-CVD method was formed.

Figure 4F:
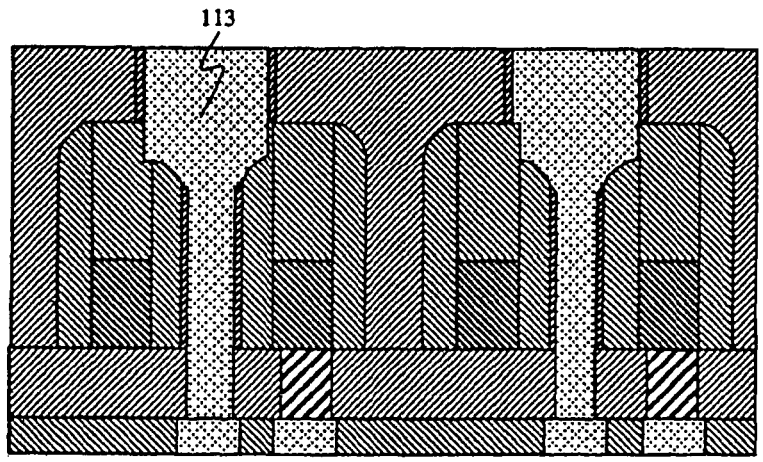

Next, as shown in FIG. 4F, the third interlayer insulating film was polished by the CMP method and the surface of the third contact plug 113 was exposed. Hereinafter, in the same way as in Embodiment 1, a semiconductor device can be manufactured.

What is claimed is:

1. A method of manufacturing a semiconductor device, comprising at least the steps of:
    (1) forming multiple word lines on a semiconductor substrate and forming a first interlayer insulating film which covers the whole surface of the word lines;
    (2) forming a first contact plug which establishes a connection to the semiconductor substrate in multiple prescribed regions of the first interlayer insulating film;
    (3) forming a second interlayer insulating film on the whole surface of the first contact plug and the first interlayer insulating film and forming a bit line contact plug which establishes a connection to part of the first contact plug in multiple prescribed regions of the second interlayer insulating film;
    (4) forming a bit line on the bit line contact plug;
    (5) forming a sacrificial interlayer film which covers the whole surface of the bit line;
    (6) forming a capacitance contact plug which establishes a connection to part of the first contact plug by piercing through the sacrificial interlayer film and the second interlayer insulating film in multiple prescribed regions of the sacrificial interlayer film;
    (7) removing the sacrificial interlayer film after forming the capacitance contact plug, to form a column of the capacitance contact plug;
    (8) forming a third interlayer insulating film on the whole surface of the column of the capacitance contact plug after forming the column and removing part of the third interlayer insulating film from a surface thereof, to expose a surface of the capacitance contact plug;
    (9) forming a fourth interlayer insulating film on the whole surface of the capacitance contact plug and the third interlayer insulating film and forming a cylinder hole in a prescribed region of the fourth interlayer insulating film, to expose a surface of the third contact hole;
    (10) forming a lower electrode of a capacitor on an inner surface of the cylinder hole; and
    (11) forming a capacitance insulating film and an upper electrode of the capacitor on the whole surface including the surface of the lower electrode,
    wherein the sacrificial interlayer film is made of amorphous carbon.

2. The method of manufacturing a semiconductor device according to claim 1, wherein a top surface and side surfaces of the bit line are covered with a silicon nitride film before forming the sacrificial interlayer film.

3. The method of manufacturing a semiconductor device according to claim 1, wherein the step of forming the capacitance contact plug comprises the steps of: forming a first contact hole in the sacrificial interlayer film; forming thereafter an insulating film on the whole surface including an inner surface of the first contact hole; forming thereafter a second contact hole in the insulating film; and forming the capacitance contact plug.

4. A method of manufacturing a semiconductor device, comprising:
    forming a plurality of word lines over a semiconductor substrate having a plurality of first diffusion regions and a plurality of second diffusion regions;
    covering the word lines with a first insulating film;
    forming a plurality of first contact plugs each has an electrical contact with an associated one of the first diffusion regions and a plurality of second contact plugs each having an electrical contact with an associated one of the second diffusion regions;
    forming a second insulating film to cover the first insulating film and the first and second contact plugs;
    forming a plurality of third contact plugs each having an electrical contact with an associated one of the first contact plugs;
    forming a plurality of bit lines each having an electrical contact with an associated one of the third contact plugs;
    forming an amorphous carbon film to cover the bit lines and the second insulating film;
    selectively removing the amorphous carbon film to form in the amorphous carbon film a plurality of first contact holes each reaching the second insulating film;
    selectively removing the second insulating film to form in the second insulating film a plurality of second contact holes, each of the second contact holes continuing with an associated one of the first contact holes and exposing a part of the second contact plugs;
    forming a plurality of third contact plugs each filling an associated ones of the first and second contact holes, each of the third contact holes being thereby en electrical contact with an associated one of the second contact plugs:
    removing the amorphous carbon film to form gaps among the third contact plugs and over the bit lines;
    filling the gaps with a fourth insulating film; and
    forming a plurality of capacitor lower electrodes each having an electrical contact with an associated one of the third contact plugs.

5. The method as claimed in claim 4, wherein forming a plurality of capacitor lower electrodes comprises:
    covering the fourth insulating film and the third contact plugs with a fifth insulating film;
    forming a plurality of capacitor holes in the fifth insulating, each of the capacitor holes reaching the fourth insulating film to expose a part of an associated one of the third contact plugs; and
    forming in the capacitor holes a plurality of conductive layers each having an electrical contact with an associated one of the third contact plugs.

6. The method as claimed in claim 5, wherein the method further comprises forming a dielectric film on each of the capacitor lower electrodes and forming a conductor layer functioning as a plurality of capacitor upper electrodes.

7. The method as claimed in claim 4, wherein the method further comprises forming a fifth insulating film on a part of a side surface of each of the first contact holes prior to forming the second contact holes.

8. The method as claimed in claim 4, wherein the method further comprises covering each of the bit lines with side and top insulating walls prior to forming the amorphous carbon film, a part of each of the first contact holes being thereby defined by the side and top insulating walls covering each of the bit lines.

9. The method as claimed in claim 8, wherein each of the second contact holes being formed in the second insulating film by use of the side insulating walls.

* * * * *